(12) United States Patent
Hsiao et al.

(10) Patent No.: US 10,310,634 B2
(45) Date of Patent: Jun. 4, 2019

(54) MOUSE

(71) Applicant: Primax Electronics Ltd., Taipei (TW)

(72) Inventors: Shao-Lun Hsiao, Taipei (TW);
Chia-Yuan Chang, Taipei (TW);
Chun-Lin Chu, Taipei (TW)

(73) Assignee: PRIMAX ELECTRONICS LTD.,
Taipei (TW)

( * ) Notice: Subject to any disclaimer, the term of this patent is extended or adjusted under 35 U.S.C. 154(b) by 0 days.

(21) Appl. No.: 15/811,627

(22) Filed: Nov. 13, 2017

(65) Prior Publication Data

US 2018/0373354 A1 Dec. 27, 2018

(30) Foreign Application Priority Data

Jun. 23, 2017 (TW) .............................. 106121099 A

(51) Int. Cl.
| | | |
|---|---|---|
| *H05K 1/18* | (2006.01) | |
| *H05K 3/30* | (2006.01) | |
| *H01H 13/04* | (2006.01) | |
| *H01H 13/10* | (2006.01) | |
| *H01H 13/14* | (2006.01) | |
| *G06F 3/0354* | (2013.01) | |

(52) U.S. Cl.
CPC ......... *G06F 3/03543* (2013.01); *H01H 13/04* (2013.01); *H01H 13/10* (2013.01); *H01H 13/14* (2013.01); *H05K 1/181* (2013.01); *H05K 3/301* (2013.01); *H05K 2201/0133* (2013.01); *H05K 2201/10053* (2013.01); *H05K 2201/2018* (2013.01)

(58) Field of Classification Search
CPC .... G06F 3/03543; H01H 13/10; H01H 13/04; H01H 13/14; H05K 1/181; H05K 2201/100053
See application file for complete search history.

(56) References Cited

U.S. PATENT DOCUMENTS

| | | | | |
|---|---|---|---|---|
| 5,059,754 A | * | 10/1991 | Kaichi ................... | H01H 13/04 200/293 |
| 5,268,674 A | * | 12/1993 | Howard .............. | G06F 3/03543 200/318 |
| 5,343,008 A | * | 8/1994 | Ipcinski ................. | H01H 13/06 200/302.2 |
| 8,735,747 B2 | * | 5/2014 | Bigand .................. | H01H 13/64 200/1 B |
| 9,536,687 B2 | * | 1/2017 | Takeuchi ............... | H01H 13/06 |
| 2001/0017614 A1 | * | 8/2001 | Hara ....................... | G06F 3/016 345/163 |

(Continued)

*Primary Examiner* — Mihir K Rayan
(74) *Attorney, Agent, or Firm* — Kirton McConkie; Evan R. Witt

(57) ABSTRACT

The present invention relates to a mouse, including a base, a cover plate provided with a hole, a circuit board, a button switch, an elastic cover, and an upper cover. The cover plate covers the base, and the circuit board is disposed on the base and located between the base and the cover plate. The button switch is disposed on the circuit board. The elastic cover covers the button switch, and extends into the hole together with the button switch, so as to prevent the button switch from being exposed out of the hole. The upper cover covers the cover plate, and the upper cover is capable of oscillating relative to the cover plate to abut against the elastic cover, so as to trigger the button switch.

9 Claims, 3 Drawing Sheets

(56) References Cited

U.S. PATENT DOCUMENTS

2012/0048707 A1* 3/2012 Nakamura ............. H01H 13/14
  200/517
2017/0308188 A1* 10/2017 Hayashi .................... H02J 7/35
2018/0356900 A1* 12/2018 Hsiao ...................... G06F 3/038

* cited by examiner

MOUSE

FIELD OF THE INVENTION

The present invention relates to an input device, and in particular, to a mouse capable of controlling movement of a cursor.

BACKGROUND OF THE INVENTION

Commonly seen computer peripheral input devices include a mouse, a keyboard, a trackball, and so on. Since the mouse may be held by a user with a palm to control movement of a cursor and accords with operation habits of most users, the mouse has become the most common input device.

First, the structure and function of a conventional mouse are described. Referring to FIG. 1, FIG. 1 is a schematic structural diagram of a conventional mouse being connected to a computer system. A computer system 17 includes a computer host 171 and a computer screen 172. The computer host 171 is separately connected to a mouse 1 and the computer screen 172, and the computer host 171 is provided with a connection port 1711. The computer screen 172 may display a window 1721 and a cursor 1722. The function of the mouse 1 is to control the cursor 1722 according to an operation of a user, so that the computer host 171 may execute a corresponding instruction. Moreover, the mouse 1 includes a body 10, a left button 11, a right button 12, a scroll wheel 13, and a connection cable 14. The left button 11 is a part of the body 10, and is located to the left of the scroll wheel 13. The left button 11 is exposed out of the body 10, so as to be pressed by a user to generate a left button signal. The right button 12 is similar to the left button 11. The right button 12 is also a part of the body 10, and is located to the right of the scroll wheel 13. The right button 12 is also exposed out of the body 10, so as to be pressed by a user to generate a right button signal. The scroll wheel 13 is disposed in the body 10 and is partially exposed out of the body 10. The scroll wheel 13 may be scrolled by a user to rotate, so as to generate a scrolling signal. The connection cable 14 is disposed in the body 10 and extends outward from the body 10. The function of the connection cable 14 is to establish a connection relationship between the mouse 1 and the computer system 17.

Next, the internal structure of the conventional mouse is described. Referring to FIG. 2, FIG. 2 is a schematic sectional view of a local structure of the conventional mouse. FIG. 2 shows the body 10, and a circuit board 15 and a button switch 16 located in the body 10. However, FIG. 2 does not show the connection cable 14, or other electronic elements located in the body 10. The body 10 includes a base 101, a cover plate 102, and an upper cover 103, and the upper cover 103 is a part of the right button 12. The circuit board 15 is disposed on the base 101, and the button switch 16 corresponding to the right button 12 is disposed on the circuit board 15. The cover plate 102 covers the base 101, the cover plate 102 is provided with a hole 1021, and the hole 1021 corresponds to the right button 12. The upper cover 103 covers the cover plate 102, and is capable of oscillating relative to the cover plate 102. The upper cover 103 is provided with a trigger portion 1031 corresponding to the hole 1021, and the trigger portion 1031 extends into the hole 1021 to contact the button switch 16. When a user presses the right button 12, the upper cover 103 oscillates relative to the cover plate 102, and the trigger portion 1031 of the upper cover 103 abuts against the button switch 16 to trigger the button switch 16, so as to cause the button switch 16 to output, through the circuit board 15, a button signal corresponding to the right button 12.

However, with the development of mice, users require a mouse to have a light and thin appearance. Electronic elements in the mouse have been miniaturized to reduce a space used by the electronic elements, and then to reduce the volume of the mouse. However, the reduction in the volume of the mouse is still limited. Therefore, a mouse having a light and thin appearance is needed.

SUMMARY OF THE INVENTION

An objective of the present invention is to provide a mouse having a light and thin appearance.

In a preferred embodiment, the present invention provides a mouse, including a base, a cover plate, a circuit board, a button switch, an elastic cover, and an upper cover. The cover plate is located on the base and covers the base. The cover plate is provided with a hole. The circuit board is disposed on the base and located between the base and the cover plate. The button switch is disposed on the circuit board and extends into the hole. The elastic cover covers the button switch, and extends into the hole together with the button switch, so as to prevent the button switch from being exposed out of the hole. The upper cover covers the cover plate, and the upper cover is capable of oscillating relative to the cover plate to abut against the elastic cover, so as to trigger the button switch.

In a preferred embodiment, the elastic cover includes a contact portion, a fixing portion, and an extending portion. The contact portion is disposed on a top end of the elastic cover and extends into the hole to contact the upper cover. A first surface of the contact portion contacts the upper cover, and a second surface of the contact portion contacts the button switch. The fixing portion is disposed on a bottom of the elastic cover, and configured to: contact an inner surface of the cover plate and fix the elastic cover onto the inner surface of the cover plate; or to contact an upper surface of the circuit board and fix the elastic cover onto the upper surface of the circuit board. The extending portion is connected to the contact portion and the fixing portion.

In brief, in the mouse of the present invention, by means of configuration of the button switch being close to the cover plate, the height between the base and the cover plate may be reduced, so as to reduce the volume of the mouse. In the mouse of the present invention, by covering the elastic cover onto the button switch, the touch feeling of a user when pressing the upper cover is improved due to the elasticity of the elastic cover. At the same time, the elastic cover may also block a noise generated when the button switch is triggered, so as to provide a function of noise reduction. In addition, the elastic cover covering the button switch may even provide functions of dust prevention and waterproofing, and prevent a phenomenon of electrostatic discharge (ESD).

DETAILED DESCRIPTION OF THE PREFERRED EMBODIMENT

Figure 3:
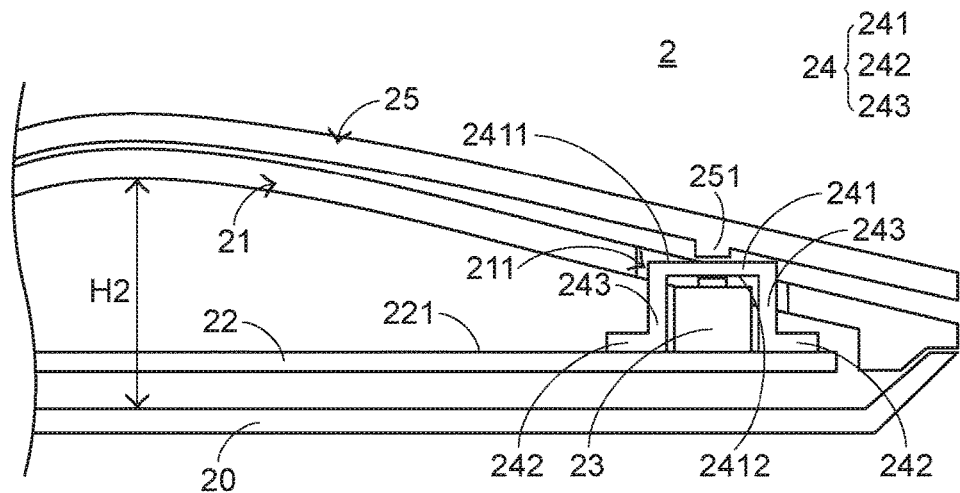
FIG. 3 is a schematic sectional view of a local structure of a mouse of the present invention according to a first preferred embodiment.

In view of puzzlement caused by the conventional technologies, the present invention provides a mouse capable of resolving the problems of the conventional technologies. First, the structure of the mouse of the present invention is described. Referring to FIG. 3, FIG. 3 is a schematic sectional view of a local structure of the mouse of the present invention according to a first preferred embodiment. A mouse 2 of the present invention includes a base 20, a cover plate 21, a circuit board 22, a button switch 23, an elastic cover 24, and an upper cover 25. The cover plate 21 is located on the base 20 and covers the base 20. The cover plate 21 is provided with a hole 211 and the hole 211 corresponds to a button (that is, a left button or a right button of the mouse). The circuit board 22 is disposed on the base 20 and located between the base 20 and the cover plate 21. The button switch 23 corresponding to the button is disposed on the circuit board 22 and is electrically connected to the circuit board 22. The button switch 23 extends into the hole 211 and is exposed out of the cover plate 21. In this preferred embodiment, the circuit board 22 is a printed circuit board (PCB). To maintain the clarity of the figure, other electronic elements disposed on the circuit board 22 are not shown in FIG. 3.

In FIG. 3, the elastic cover 24 covers the button switch 23, and extends into the hole 211 together with the button switch 23, so as to prevent the button switch 23 from being exposed out of the hole 211. The upper cover 25 covers the cover plate 21, and the upper cover 25 is provided with a trigger portion 251 which may contact the elastic cover 24. The upper cover 25 corresponds to a button (that is, the left button or the right button of the mouse). When the button is pressed, the upper cover 25 is capable of oscillating relative to the cover plate 21 to abut against the elastic cover 24, so that the elastic cover 24 deforms to trigger the button switch 23. By means of this, the button switch 23 may output a button signal.

The elastic cover 24 includes a contact portion 241, a fixing portion 242, and an extending portion 243. The contact portion 241 is disposed on a top end of the elastic cover 24 and extends into the hole 211 to contact a trigger portion 251 of the upper cover 25. A first surface 2411 of the contact portion 241 contacts the trigger portion 251 of the upper cover 25, and a second surface 2412 of the contact portion 241 contacts the button switch 23. The fixing portion 242 is disposed on a bottom of the elastic cover 24, and may contact an upper surface 221 of the circuit board 22 and fix the elastic cover 24 onto the upper surface 221 of the circuit board 22. In terms of the extending portion 243, the function of the extending portion 243 is to connect the contact portion 241 and the fixing portion 242. In this preferred embodiment, the fixing portion 242 is fixed onto the upper surface 221 of the circuit board 22 in a pasting manner, the contact portion 241, the fixing portion 242, and the extending portion 243 are integrally molded, and the elastic cover 24 is produced by using a soft material, such as a silicone rubber material.

Next, an operation scenario of the mouse 2 of the present invention is described. When a user presses the upper cover 25 corresponding to the button, the upper cover 25 oscillates relative to the cover plate 21, and the trigger portion 251 of the upper cover 25 abuts against the contact portion 241. The contact portion 241 being abutted against deforms to rigger the button switch 23, so as to cause the button switch 23 to output a button signal. By covering the elastic cover 24 onto the button switch 23, the touch feeling of the user when pressing the upper cover 25 is improved due to the elasticity of the elastic cover 24. At the same time, the elastic cover 24 provides a function of covering the button switch 23, and may also block a noise generated when the button switch 23 is triggered, so as to provide a function of noise reduction.

Figure 1:
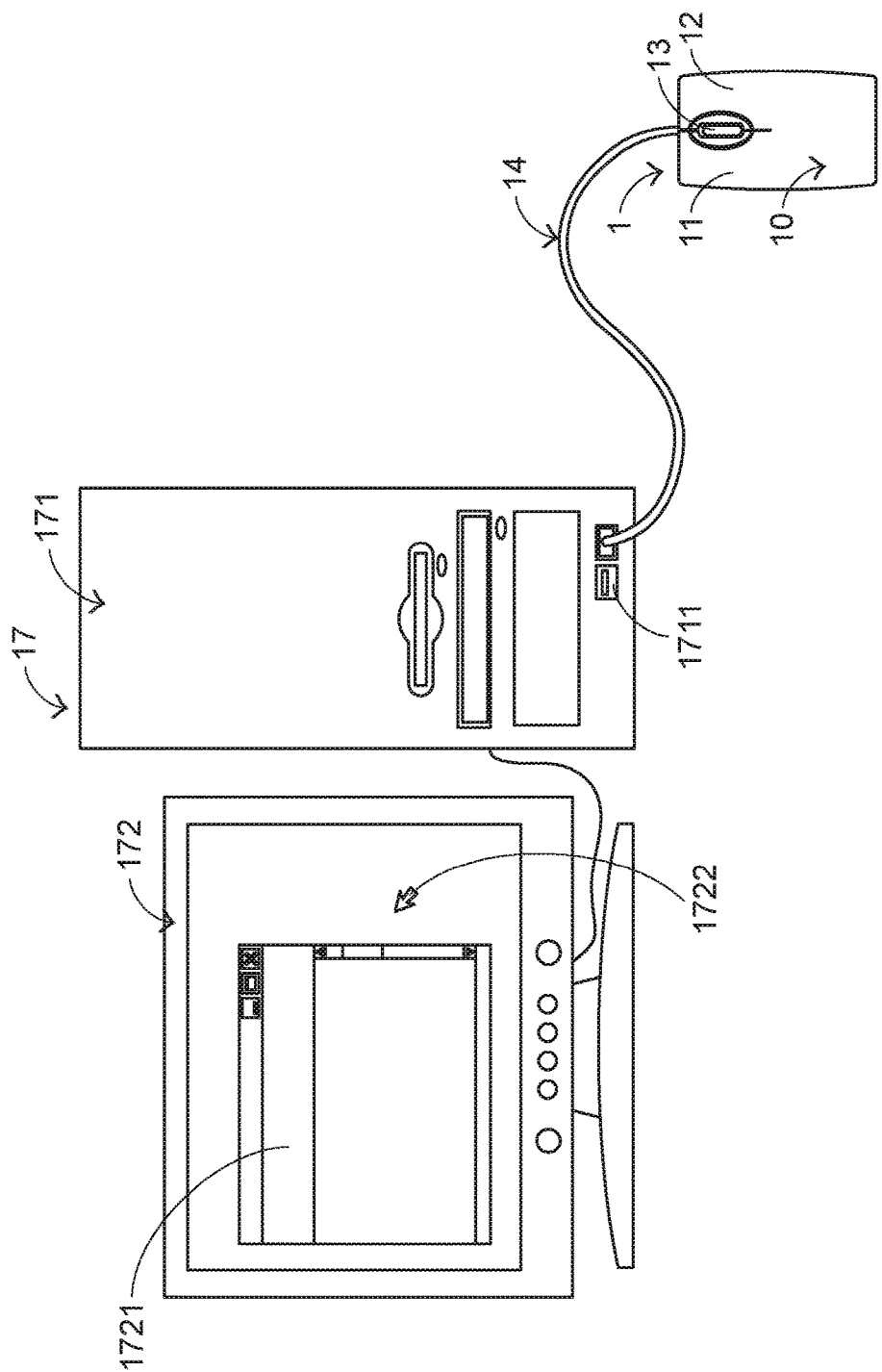
FIG. 1 is a schematic structural diagram of a conventional mouse being connected to a computer system.
Figure 2:
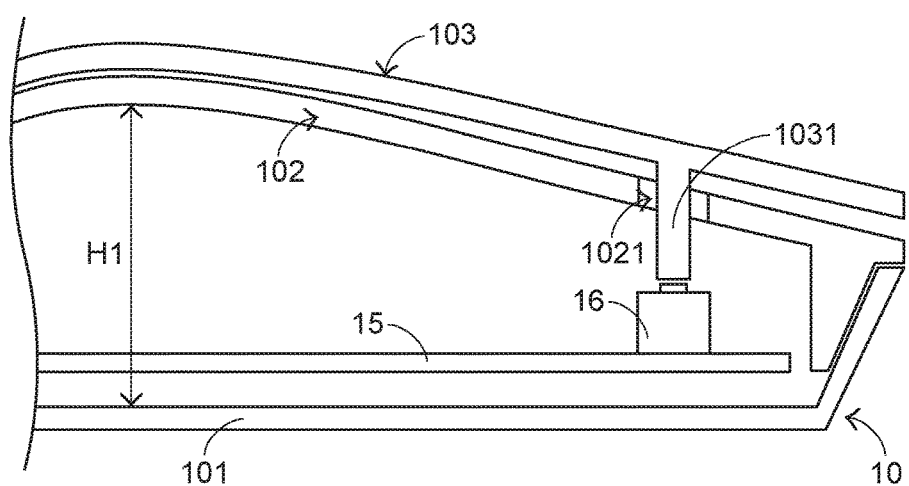
FIG. 2 is a schematic sectional view of a local structure of the conventional mouse.

It can be seen from FIG. 3 that the button switch 23 of the mouse 2 of the present invention is disposed close to the cover plate 21, and may extend into the hole 211 of the cover plate 21. By means of configuration of the button switch 23 being close to the cover plate 21, the height H2 between the base 20 and the cover plate 21 is less than the height H1 between the base 101 and the cover plate 102 in FIG. 2. Therefore, the volume of the mouse 2 of the present invention is reduced. It needs to be noted that since the button switch 23 extends into the hole 211, external dust is easy to pass through the hole 211 to enter the button switch 23. Therefore, by covering the elastic cover 24 onto the button switch 23, the button switch 23 is prevented from being exposed out of the hole 211, so as to provide a function of dust prevention. On the other hand, due to the structure of the button switch 23 extending into the hole 211, external charges are easy to enter the button switch 23. Therefore, covering the elastic cover 24 onto the button switch 23 may also block the external charges, so as to prevent a phenomenon of electrostatic discharge (ESD).

Figure 4:
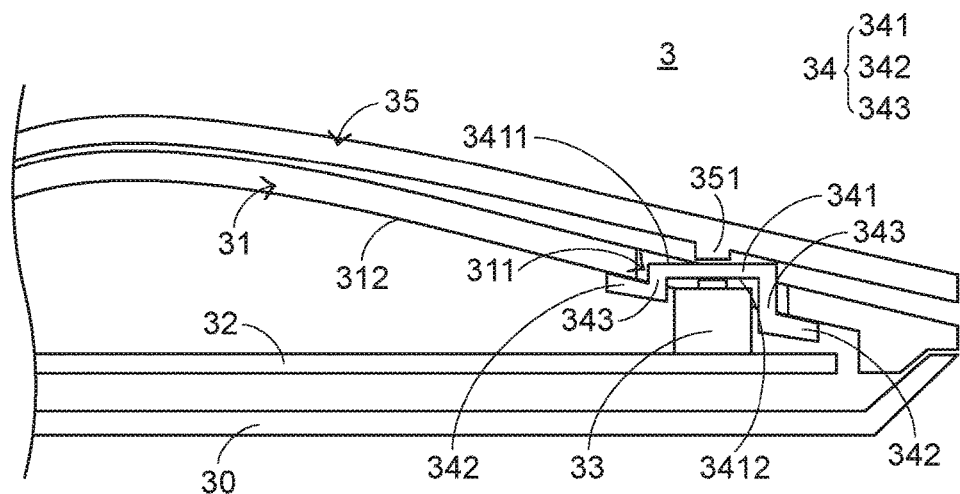
FIG. 4 is a schematic sectional view of a local structure of a mouse of the present invention according to a second preferred embodiment.

In addition, the present invention further provides a second preferred embodiment different from the foregoing practice. Referring to FIG. 4, FIG. 4 is a schematic sectional view of a local structure of a mouse of the present invention according to the second preferred embodiment. A mouse 3 of the present invention includes a base 30, a cover plate 31, a circuit board 32, a button switch 33, an elastic cover 34, and an upper cover 35. The cover plate 31 is provided with a hole 311, and the hole 311 corresponds to a button (that is, a left button or a right button of the mouse). The elastic cover 34 includes a contact portion 341, a fixing portion 342, and an extending portion 343. The structure and function of each element of the mouse 3 are roughly the same as those of the mouse 2 of the foregoing preferred embodiment, and similarities are not described herein again. A difference between the mouse 3 of this preferred embodiment and the foregoing preferred embodiment lies in a configuration manner of the elastic cover 34.

In FIG. 4, the contact portion 341 is disposed on a top end of the elastic cover 34 and extends into the hole 311 to contact a trigger portion 351 of the upper cover 35. A first surface 3411 of the contact portion 341 contacts the trigger portion 351 of the upper cover 35, and a second surface 3412 of the contact portion 341 contacts the button switch 33. The fixing portion 342 is disposed on a bottom of the elastic cover 34, and may contact an inner surface 312 of the cover plate 31 and fix the elastic cover 34 onto the inner surface 312 of the cover plate 31, so as to truly isolate the button switch 33. In this preferred embodiment, the fixing portion 342 is fixed onto the inner surface 312 of the cover plate 31 in a pasting manner.

In this preferred embodiment, by fixing the elastic cover 34 onto the inner surface 312 of the cover plate 31, the button switch 33 may be isolated from the external environment, so as to truly block external dust, liquids, and charges passing through the hole 311. Therefore, the external dust, liquids, and charges cannot contact the button switch 33 and the circuit board 32. That is, other than a function of dust prevention and preventing ESD, the mouse 3 of this preferred embodiment even provides a function of waterproofing.

The above descriptions are merely preferred embodiments of the present invention, and are not intended to limit the patent scope of the present invention. Therefore, any equivalent change or modification completed without departing from the spirit disclosed in the present invention shall fall within the patent scope of this application.

What is claimed is:

1. A mouse, comprising:
   a base;
   a cover plate, located on the base and covering the base, and the cover plate being provided with a hole;
   a circuit board, disposed on the base and located between the base and the cover plate;
   a button switch, disposed on the circuit board and extending into the hole;
   an elastic cover, covering the button switch, and extending into the hole together with the button switch, so as to prevent the button switch from being exposed out of the hole; and
   an upper cover, covering the cover plate, and the upper cover being capable of oscillating relative to the cover plate to abut against the elastic cover, so as to trigger the button switch, wherein the elastic cover comprises:
   a contact portion, disposed on a top end of the elastic cover, and extending into the hole to contact the upper cover, wherein a first surface of the contact portion contacts the upper cover, and a second surface of the contact portion contacts the button switch;
   a fixing portion, disposed on a bottom of the elastic cover, and configured to contact an inner surface of the cover plate and fix the elastic cover onto the inner surface of the cover plate; and
   an extending portion, connected to the contact portion and the fixing portion.

2. The mouse according to claim 1, wherein the upper cover is provided with a trigger portion in contact with the contact portion, and is configured to abut against the contact portion when the upper cover is pressed to oscillate relative to the cover plate, so as to cause the contact portion being abutted against to trigger the button switch.

3. The mouse according to claim 1, wherein the contact portion, the fixing portion, and the extending portion are integrally molded.

4. The mouse according to claim 1, wherein the elastic cover is produced by using a silicone rubber material.

5. The mouse according to claim 1, wherein the fixing portion is fixed onto the inner surface of the cover plate in a pasting manner.

6. A mouse, comprising:
   a base;
   a cover plate, located on the base and covering the base, and the cover plate being provided with a hole;
   a circuit board, disposed on the base and located between the base and the cover plate;
   a button switch, disposed on the circuit board and extending into the hole;
   an elastic cover, covering the button switch, and extending into the hole together with the button switch, so as to prevent the button switch from being exposed out of the hole; and
   an upper cover, covering the cover plate, and the upper cover being capable of oscillating relative to the cover plate to abut against the elastic cover, so as to trigger the button switch, wherein the elastic cover comprises:
   a contact portion, disposed on a top end of the elastic cover, and extending into the hole to contact the upper cover, wherein a first surface of the contact portion contacts the upper cover, and a second surface of the contact portion contacts the button switch;
   a fixing portion, disposed on a bottom of the elastic cover, and configured to contact an upper surface of the circuit board and fix the elastic cover onto the upper surface of the circuit board; and
   an extending portion, connected to the contact portion and the fixing portion.

7. The mouse according to claim 6, wherein the fixing portion is fixed onto the upper surface of the circuit board in a pasting manner.

8. The mouse according to claim 6, wherein the contact portion, the fixing portion, and the extending portion are integrally molded.

9. The mouse according to claim 6, wherein the elastic cover is produced by using a silicone rubber material.

* * * * *